(12) United States Patent
Kim et al.

(10) Patent No.: US 8,330,230 B2
(45) Date of Patent: Dec. 11, 2012

(54) SEMICONDUCTOR DEVICE PAD HAVING THE SAME VOLTAGE LEVEL AS THAT OF A SEMICONDUCTOR SUBSTRATE

(75) Inventors: Sung-Hoon Kim, Seongnam-si (KR); Joung-Yeal Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1078 days.

(21) Appl. No.: 11/828,536

(22) Filed: Jul. 26, 2007

(65) Prior Publication Data

US 2008/0150143 A1    Jun. 26, 2008

(30) Foreign Application Priority Data

Dec. 22, 2006    (KR) ........................ 10-2006-0133162

(51) Int. Cl.
*H01L 29/76*    (2006.01)
*H01L 29/94*    (2006.01)

(52) U.S. Cl. ...................................... 257/382; 257/383

(58) Field of Classification Search .................. 257/207, 257/208, 211, 382–385, E23.01, E23.013, 257/E23.015
See application file for complete search history.

(56) References Cited

U.S. PATENT DOCUMENTS

| | | | | |
|---|---|---|---|---|
| 5,237,187 A | * | 8/1993 | Suwanai et al. | 257/296 |
| 6,097,067 A | * | 8/2000 | Ouchi et al. | 257/369 |
| 6,329,680 B1 | * | 12/2001 | Yoshida et al. | 257/296 |
| 6,486,558 B2 | * | 11/2002 | Sugiyama et al. | 257/758 |
| 6,914,300 B2 | | 7/2005 | Hirose et al. | |

FOREIGN PATENT DOCUMENTS

| | | |
|---|---|---|
| JP | 2003133421 | 5/2003 |
| JP | 2004-296880 | 10/2004 |
| JP | 2004319627 | 11/2004 |

* cited by examiner

*Primary Examiner* — Hung Vu
(74) *Attorney, Agent, or Firm* — Volentine & Whitt, PLLC

(57) ABSTRACT

A semiconductor device pad is configured to have the same voltage level as that of a semiconductor substrate. The pad includes a semiconductor substrate having a junction area doped with a high concentration of impurity ions, a polylayer portion at least a portion of which is electrically connected to the junction area and a metal layer portion electrically connected to the polylayer portion and receiving a voltage externally applied. The metal layer is configured to transfer the received voltage to the semiconductor substrate.

13 Claims, 6 Drawing Sheets

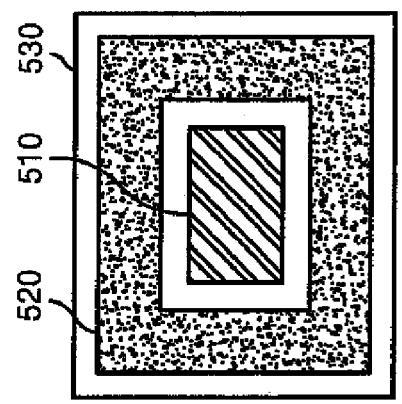
FIG. 4A
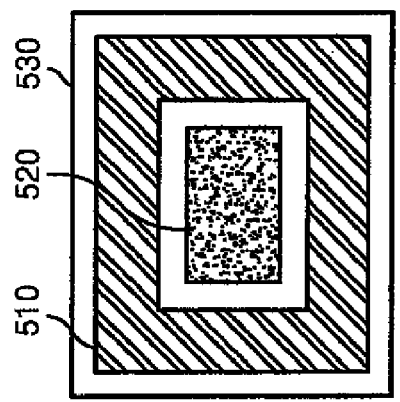
FIG. 4B
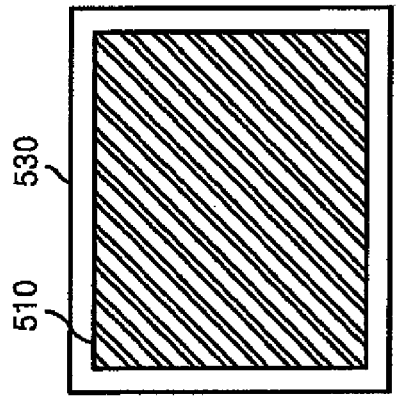
FIG. 4C
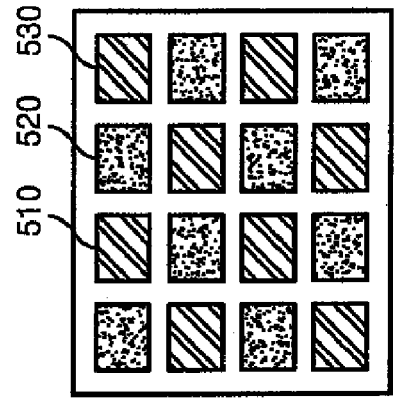
FIG. 4D
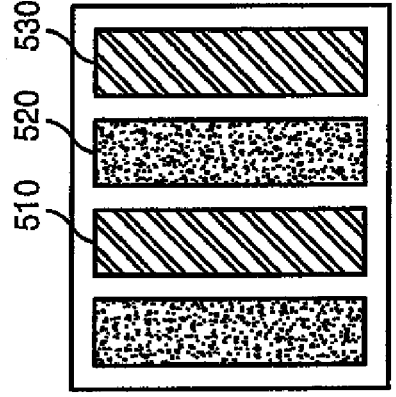
FIG. 4E
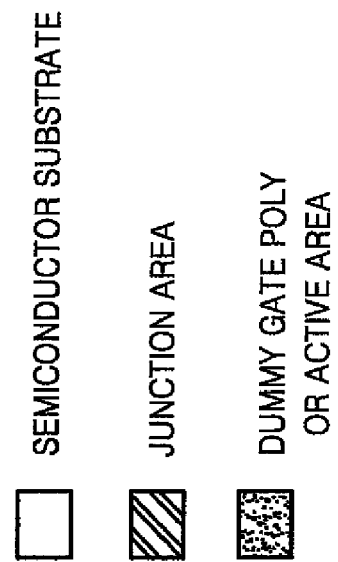
□ SEMICONDUCTOR SUBSTRATE
▨ JUNCTION AREA
▦ DUMMY GATE POLY OR ACTIVE AREA

SEMICONDUCTOR DEVICE PAD HAVING THE SAME VOLTAGE LEVEL AS THAT OF A SEMICONDUCTOR SUBSTRATE

CROSS-REFERENCE TO RELATED APPLICATION

This U.S. non-provisional patent application claims priority under 35 U.S.C. §119 of Korean Patent Application No. 10-2006-0133162, filed on Dec. 22, 2006, the entire contents of which are hereby incorporated by reference.

BACKGROUND OF THE INVENTION

1. Field of the Invention

The present invention relates to a pad of a semiconductor device. More particularly, embodiments of the invention relate to a semiconductor pad having the same voltage level as that of an associated semiconductor substrate.

2. Discussion of Related Art

FIG. 1 illustrates a semiconductor device 100 having a plurality of pads 110 and a semiconductor chip 120. The semiconductor device 100 is electrically connected externally from the memory chip 120 using pads 110 and receives power needed to drive semiconductor chip 120, for example, a power voltage Vdd, a ground voltage Vss, and associated signals.

FIG. 2 is a sectional view of one of the pads 110 shown in FIG. 1. In particular, pad 200 of the semiconductor device 100 includes semiconductor substrate 210, a dummy pattern 220, a metal layer portion 230, a polylayer portion (PP) 240, and first and second insulation films 251 and 252. Dummy pattern 220 includes dummy gate poly 221 (GP) and dummy active 222 (Dum ACT). Metal layer portion 230 includes first metal layer 231 (M1), a second metal layer 232 (M2), and a third metal layer 233 (M3). First metal layer 231 receives an external voltage selectively and electrically connected to second metal layer 232 and third metal layer 233. First insulation film 251, polylayer portion 240, second insulation film 252, dummy gate poly 221, and dummy active 222 are located under third metal layer 233. These layers are formed as a dummy to have the same step as the peripheral area in semiconductor device 100 and reduce the stress generated during wire bonding between first metal layer 231 and a semiconductor pin (not shown). In the semiconductor device 100 configured as above, a particular voltage (Vss or Vdd) is applied by separately forming a plug to apply a bulk bias to semiconductor substrate 210 based on the substrate type. The applied voltage Vss or Vdd is used as a bulk bias of the semiconductor device which may be, for example, a transistor. Thus, a method is needed which provides an area of the semiconductor substrate 210 located under pad 200 to have the same voltage level as an externally applied voltage Vss or Vdd to utilize the area of the semiconductor substrate 210 as a plug to apply a bulk bias to the device.

SUMMARY OF THE INVENTION

Exemplary embodiments of the present invention are directed to a semiconductor pad structure that receives the same voltage as that of a semiconductor substrate. In an exemplary embodiment, the pad of the semiconductor device includes a semiconductor substrate having a junction area doped with a high concentration of impurity ions. A polylayer portion is disposed on the substrate at least a portion of which is electrically connected to the junction area. A metal layer portion is disposed on the polylayer portion and electrically connected to the polylayer portion. The metal layer receives an externally applied voltage and transfers the received voltage to the semiconductor substrate.

BRIEF DESCRIPTION OF THE DRAWINGS

FIGS. 4A through 4E are plan views showing the structures of various pads of semiconductor devices according to embodiments of the present invention.

DESCRIPTION OF EMBODIMENTS

Figure 1:
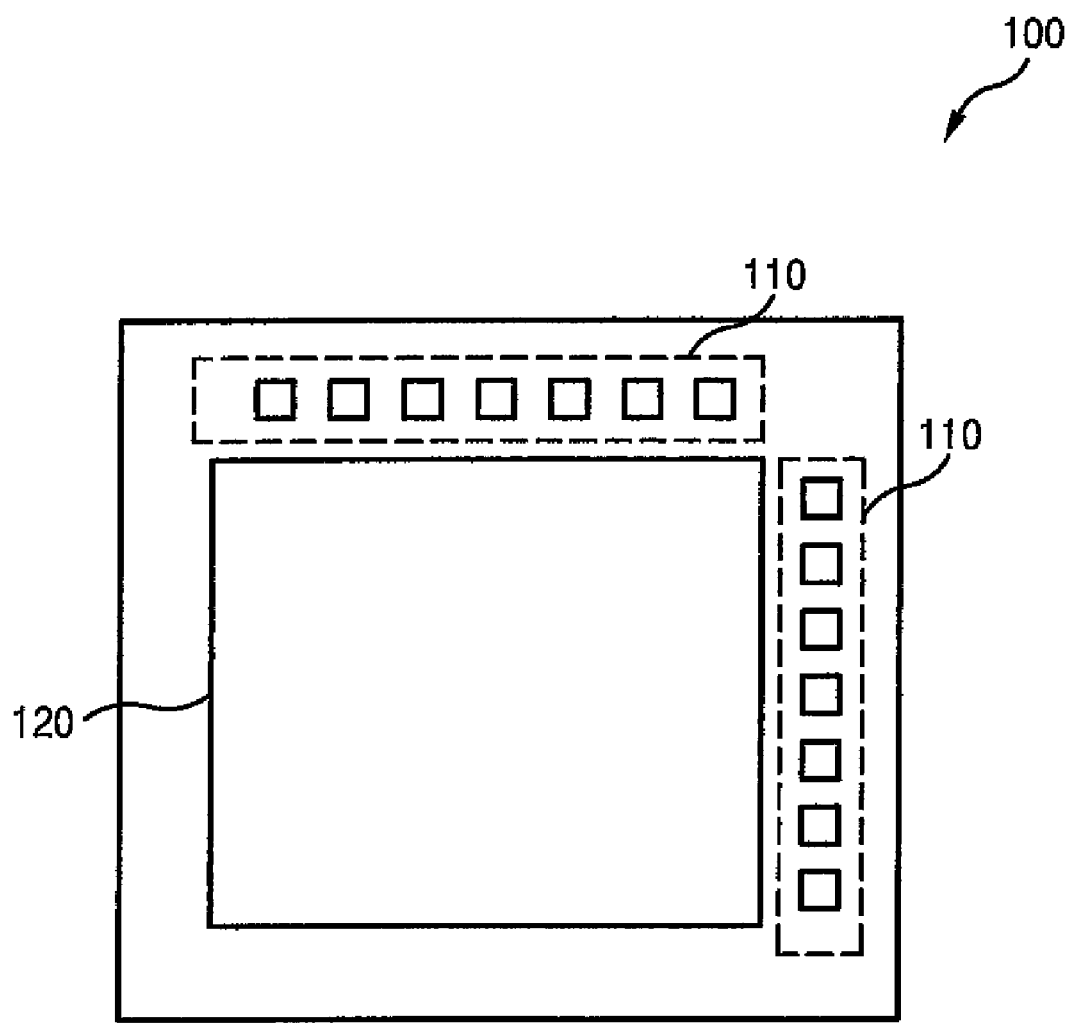
FIG. 1 illustrates a conventional semiconductor device having a general pad.
Figure 2:
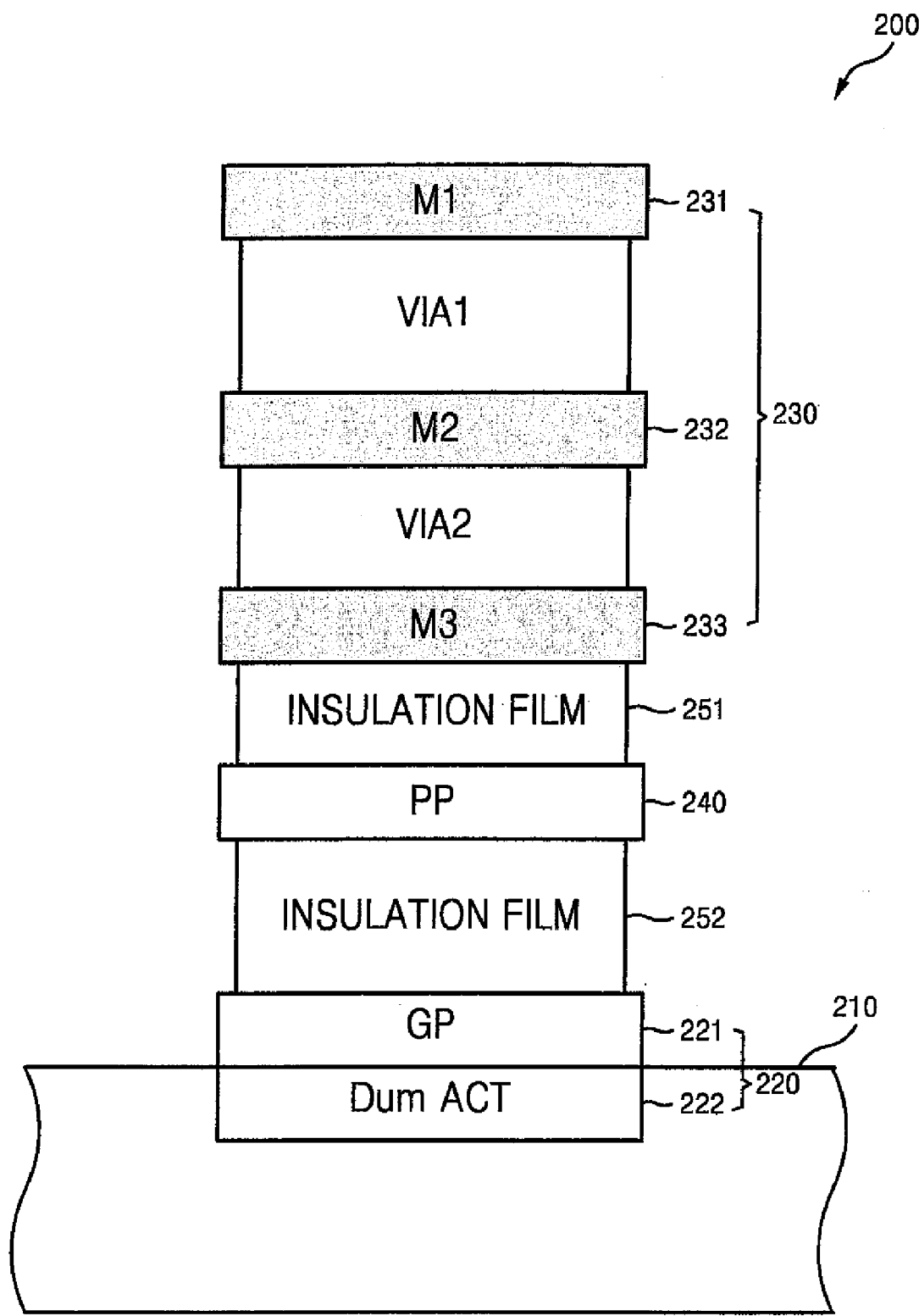
FIG. 2 is a sectional view showing the structure of the pad shown in FIG. 1.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. In addition, it is understood that when a layer is referred to as being "on" another layer or substrate, the layer can be directly on the other layer or substrate, or intervening layers may also be present.

Figure 3A:
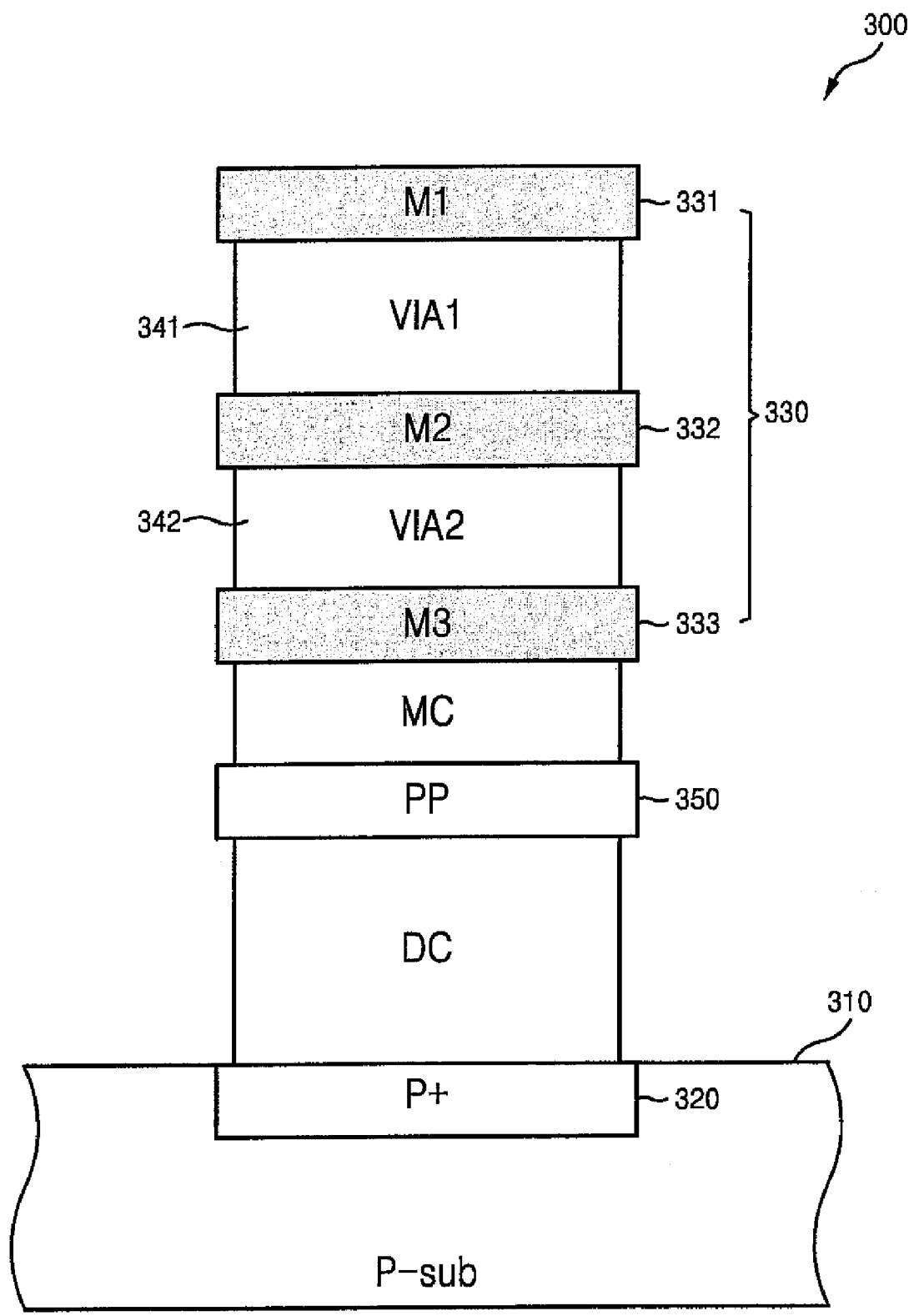
FIGS. 3A through 3C are sectional views showing the structures of various pads of a semiconductor device according to embodiments of the present invention.
Figure 3B:
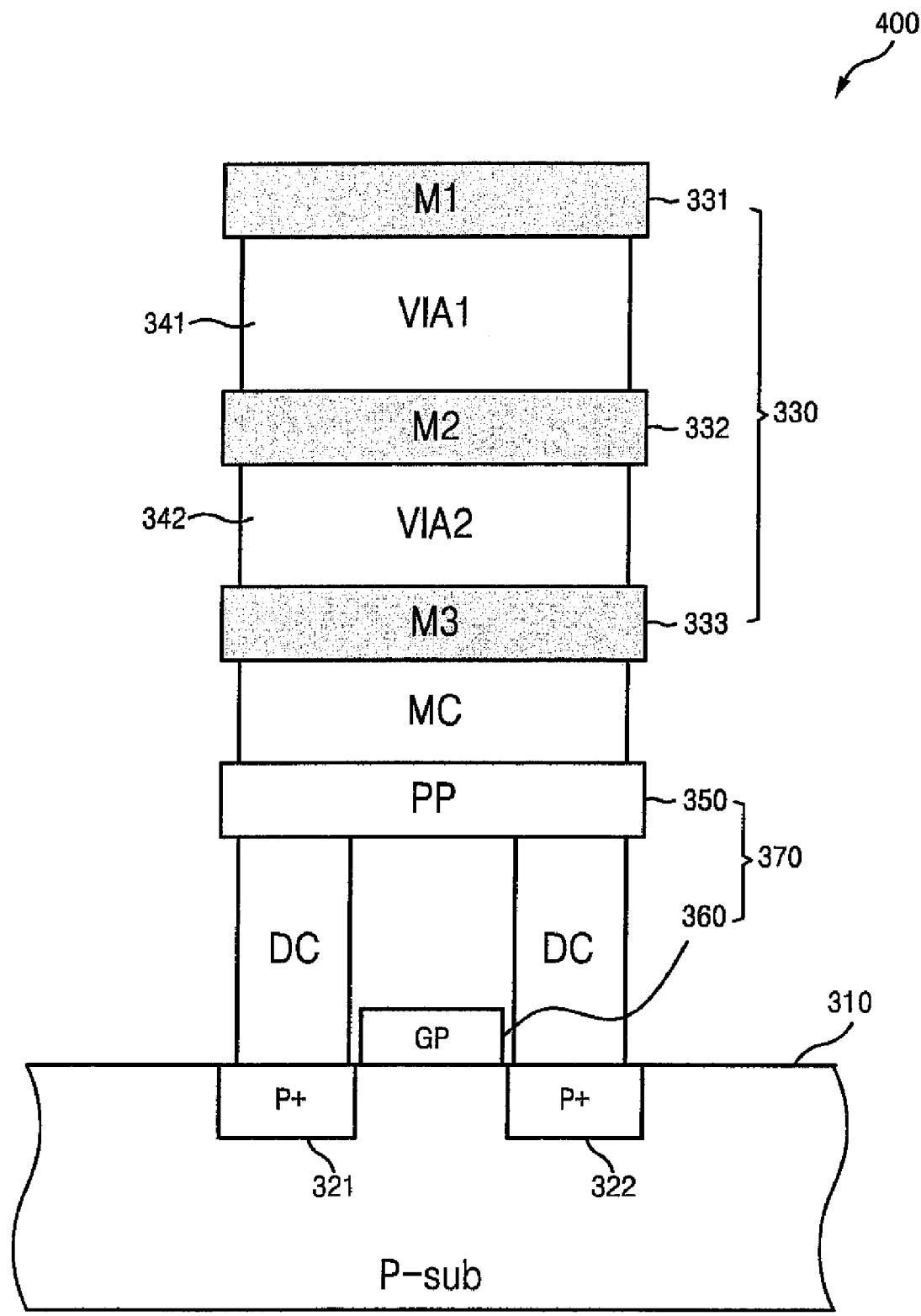
Figure 3C:
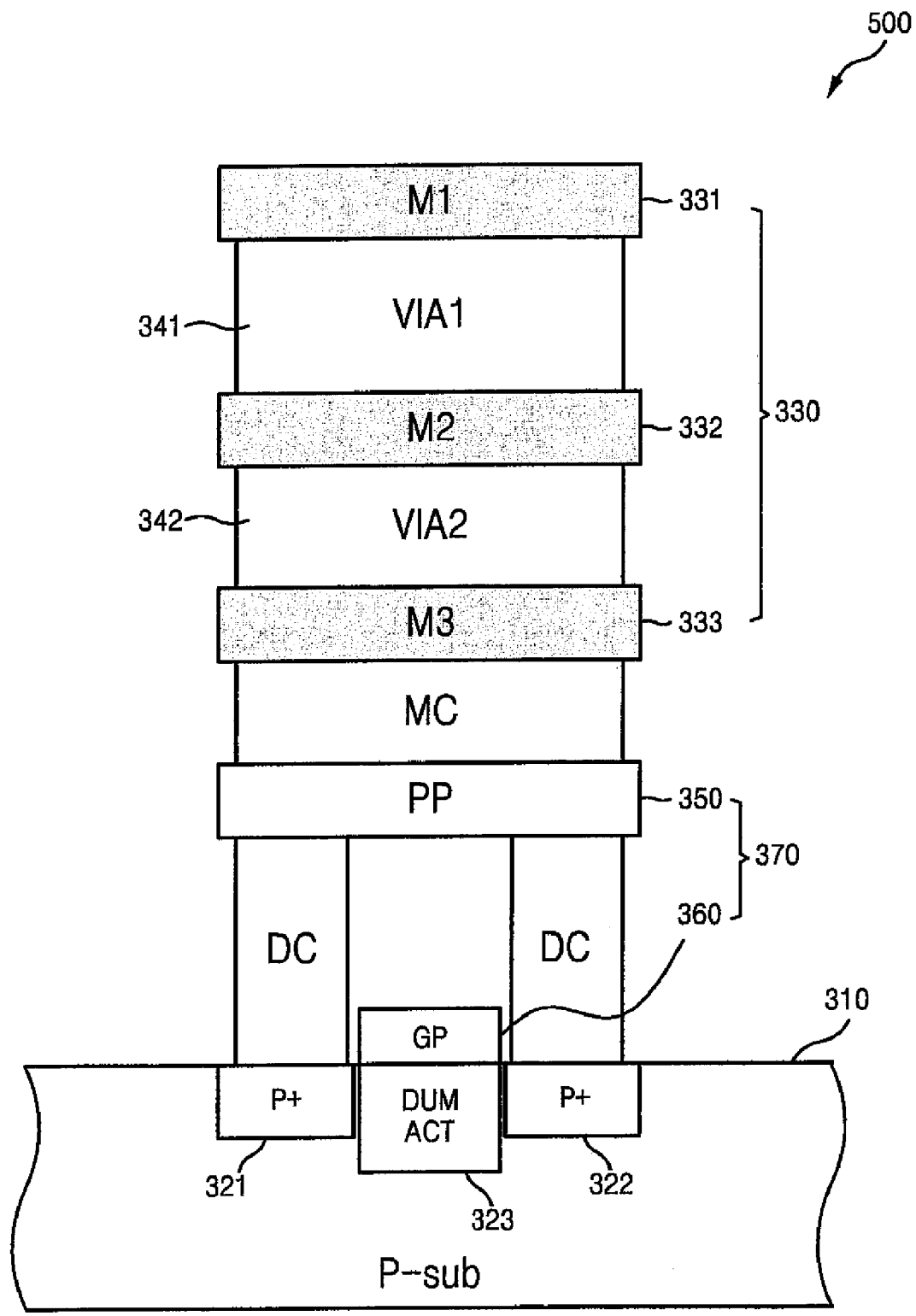

FIG. 3A illustrates pad 300 of the semiconductor device including substrate 310, junction area 320, metal layer portion 330, and polylayer portion 350. Pad 300 may be a pad for receiving an external voltage Vdd or a ground voltage Vss. For example, when substrate 310 is a P type semiconductor substrate (P-Sub) as shown in FIGS. 3A through 3C, pad 300 receives ground voltage Vss. Although not shown, when semiconductor substrate 310 is an N type semiconductor substrate (N-Sub), pad 300 receives power voltage Vdd.

As shown in FIG. 3A, the ground voltage Vss is used as a bulk bias of a P-type substrate (P-sub) for a device formed on substrate 310 which may be, for example, a transistor. Alternatively, a power voltage Vdd is used as a bulk bias for an N-type substrate. Thus, based on the type of substrate 310, pad 300 may be configured to receive power voltage Vdd or ground voltage Vss. Junction area 320 is an area of high concentration of doped impurity ions located in substrate 310 which may be formed together with a junction area of a memory chip (not shown). Junction area 320 reduces the ohmic resistance when a direct contact DC is associated with substrate 310. Junction area 320 is formed by doping one of a high concentration of P type impurity ions (hereinafter, referred to as P+ type impurity ions) and a high concentration of N type impurity ions (hereinafter, referred to as N+ type impurity ions) based on the type of the semiconductor substrate 310. That is, when substrate 310 is a P type substrate (P-Sub), junction area 320 is doped with P+ type impurity ions and when substrate 310 is an N type semiconductor substrate (N-Sub), junction area 320 is doped with N+ type impurity ions.

Metal layer portion 330 may include at least one metal layer and as shown in FIG. 3A may include three metal layers 331, 332, and 333 electrically connected to each through first VIA 341 and second VIA 342. First metal layer 331 is connected to an external pin (not shown) through a wire using a bonding material such as gold, and receives an external voltage Vss or Vdd. Second metal layer 332 is electrically connected to first metal layer 331 through first VIA 341. Third metal layer 333 is electrically connected to second metal layer 332 through second VIA 342 and electrically connected to polylayer portion 350 by a metal contact. Metal layer portion 330 may also be defined by N number of metal layers, where N is a natural number. Each of the first and second VIAs 341 and 342 includes a plurality of VIAs to firmly connect metal layers 331, 332, and 333. Polylayer portion 350 is electrically connected to junction area 320 through direct contact DC. Polylayer portion 350 is formed of a single polylayer, but may also include N number of polylayers where N is a natural number. Polylayer 350 may be one of a plate poly or a bit line poly. Since the external voltage Vss or Vdd received through first metal layer 331 by electrically connecting the first metal layer or bonding pad and substrate 310, the external voltage Vss or Vdd can be used as a bulk bias for the semiconductor substrate 310. Thus, it is possible to transfer the external voltage Vss or Vdd to the semiconductor substrate using the pad without separately installing a plug necessitating layout changes.

FIG. 3B illustrates a dummy pattern formed on a semiconductor device pad 400 which includes substrate 310, a plurality of junction areas 321 and 322, metal layer portion 330, and polylayer portion 370. Substrate 310 and metal layer 330 are the same as those described with reference to FIG. 3A. Polylayer portion 370 includes polylayer portion 350 (same as shown in FIG. 3A) and dummy gate poly 360 selected from a plate poly and a bit line poly. Dummy gate poly 360 is formed together when a gate poly (not shown) is disposed on the memory chip. First junction area 321 and the second junction are 322 are located in an area other than that where dummy gate poly 360 is formed. At least one of the first and second junction areas 321 and 322 is electrically connected to polylayer portion 350 through direct contact DC. Pad 400 may include a plurality of junction areas. In addition, first and second junction areas 321 and 322 are doped with one of the P+ type impurity ions or N+ type impurity ions based on the type of the substrate 310 employed. That is, when semiconductor substrate 310 is a P type substrate (P-sub), first and second junction areas 321 and 322 are doped with P+ type impurity ions. When substrate 310 is an N type substrate (N-sub), first and second junction areas 321 and 322 are doped with N+ type impurity ions. In this manner, by electrically connecting the constituent elements from first metal layer 331 to substrate 310 by selecting the ground voltage Vss pad or power voltage Vdd pad based on the type of substrate employed, the ground voltage Vss or the power voltage Vdd can be used as bulk bias for semiconductor devices formed on a chip.

FIG. 3C illustrates a case in which the dummy active area is formed on the pad of the semiconductor device shown in FIG. 3B. Pad 500 includes substrate 310, junction areas 321 and 322, metal layer portion 300, polylayer portion 370, and dummy active area 323. Dummy active area 323 is formed in a lower semiconductor substrate area of dummy gate poly GP 360 shown in FIG. 3B. Since the other portions of pad 500 are the same as those described with reference to FIG. 3B, detailed descriptions thereof will be omitted for convenience. When substrate 310 is a P type semiconductor substrate (P-sub), the ground voltage Vss pad is utilized and when substrate 310 is an N type substrate (N-sub), the power voltage Vdd pad is utilized. Thus, it is possible to transfer the external voltage (Vss or Vdd) to the substrate 310 using the disclosed pad without installing a separate plug necessitating a layout change.

FIGS. 4A through 4E are plan views of various pad structures including junction area 510 and substrate 530. Junction area 510 is electrically connected to upper layers such as a polylayer and a metal layer. As shown in FIGS. 4A through 4E, the pad of the semiconductor device may be embodied into a variety of shapes based on the position of junction area 510. For example, in FIG. 4A, the dummy gate poly or dummy active area of the pad does not exist. In this case, only junction area 510 is formed on substrate 530 and is electrically connected to the upper layers. In FIG. 4B, junction area 510 is formed at an edge portion of the pad and is electrically connected to the upper layers while a dummy gate poly or dummy active area 520 is formed inside the pad. In FIG. 4C, junction area 510 is formed toward the center of the pad and is electrically connected to the upper layers while the dummy gate poly or dummy active area 520 exists at the edge portion of the pad. In FIG. 4D, junction area 510 and the dummy gate poly or dummy active area 520 are vertically formed in stripes while junction area 510 is electrically connected to the upper layers. In FIG. 4E, junction area 510 and dummy gate poly or dummy active area 520 are formed in a checkerboard pattern while junction area 510 is electrically connected to the upper layers. As described above, the voltage pad according to the present invention can be used as a plug to prevent a latch-up phenomenon of the semiconductor device without changing the semiconductor device layout.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A pad of a semiconductor device through which a bulk bias voltage is applied to a semiconductor substrate, the pad comprising:
    a junction area of the semiconductor substrate doped with a high concentration of impurity ions to reduce the ohmic contact resistance of the junction area relative to the semiconductor substrate;
    a polylayer portion disposed on the semiconductor substrate and electrically connected to the junction area through a direct contact; and
    a metal layer portion disposed on the polylayer portion, electrically connected to the polylayer portion and receiving a voltage having a fixed level, such that the voltage is directly applied to the semiconductor substrate through the direct contact and the junction area as the bulk bias voltage,
    wherein the junction area comprises first and second junction areas separately disposed in the semiconductor substrate, and
    the direct contact comprises a first direct contact disposed between the polylayer portion and the first junction area, and a second direct contact separate from the first direct contact and disposed between the polylayer portion and the second junction area.

2. The pad of the semiconductor device of claim 1 wherein the metal layer portion comprises at least one metal layer.

3. The pad of the semiconductor device of claim 2 wherein the metal layer portion comprises at least two metal layers each electrically connected to the other through a via.

4. The pad of the semiconductor device of claim 1 wherein the polylayer portion comprises at least one polylayer.

5. The pad of the semiconductor device of claim 1 wherein the polylayer portion is one of a dummy gate poly, a plate poly, and a bit line poly.

6. The pad of the semiconductor device of claim 1 further comprising a metal contact electrically connecting the metal layer portion and the polylayer portion.

7. The pad of the semiconductor device of claim 1 further comprising a dummy pattern disposed on the semiconductor substrate.

8. The pad of the semiconductor device of claim 1 wherein the semiconductor substrate is P-type, the junction area is doped with P+ type impurity ions, and the voltage is ground voltage (Vss).

9. The pad of the semiconductor device of claim 1 wherein the semiconductor substrate is N-type, the junction area is doped with N+ type impurity ions, and the voltage is an externally applied power voltage (Vdd).

10. The pad of the semiconductor device of claim 1, further comprising:
   a dummy active area formed in the semiconductor substrate between the first and second junction areas.

11. The pad of the semiconductor device of claim 10, further comprising:
   a dummy gate poly formed on the dummy active area of the semiconductor substrate between the first and second direct contacts.

12. The pad of the semiconductor device of claim 1, further comprising:
   a dummy gate poly formed on the semiconductor substrate between the first and second direct contacts.

13. A semiconductor device comprising:
   a semiconductor substrate;
   a pad through which a bulk bias voltage is applied to the semiconductor substrate, wherein the pad comprises:
   a junction area of the semiconductor substrate doped with a high concentration of impurity ions to reduce the ohmic contact resistance of the junction area relative to the semiconductor substrate;
   a polylayer portion disposed on the semiconductor substrate and electrically connected to the junction area through a direct contact; and
   a metal layer portion disposed on the polylayer portion, electrically connected to the polylayer portion and receiving a voltage having a fixed level, such that the voltage is directly applied to the semiconductor substrate through the direct contact and the junction area as the bulk bias voltage,
   wherein the junction area comprises first and second junction areas separately disposed in the semiconductor substrate, and
   the direct contact comprises a first direct contact disposed between the polylayer portion and the first junction area, and a second direct contact separate from the first direct contact and disposed between the polylayer portion and the second junction area.

* * * * *